United States Patent
Waldis et al.

(10) Patent No.: US 8,717,531 B2
(45) Date of Patent: May 6, 2014

(54) MIRROR FOR GUIDING A RADIATION BUNDLE

(75) Inventors: Severin Waldis, Aalen (DE); Florian Bach, Oberkochen (DE); Daniel Benz, Winnenden (DE); Armin Werber, Gottenheim (DE); Wilfried Noell, Neuchatel (CH); Dirk Heinrich Ehm, Lauchheim (DE); Stefan Wiesner, Lauchheim (DE); Dieter Kraus, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 614 days.

(21) Appl. No.: 12/707,783

(22) Filed: Feb. 18, 2010

(65) Prior Publication Data

US 2010/0261120 A1  Oct. 14, 2010

Related U.S. Application Data

(60) Provisional application No. 61/167,929, filed on Apr. 9, 2009.

(30) Foreign Application Priority Data

Dec. 17, 2009  (DE) .......................... 10 2009 054 869

(51) Int. Cl.
  *G03B 27/52*  (2006.01)
(52) U.S. Cl.
  USPC ........................................................... 355/30
(58) Field of Classification Search
  USPC .................. 355/53, 30, 71; 430/322; 359/883
  See application file for complete search history.

(56) References Cited

U.S. PATENT DOCUMENTS

| | | | |
|---|---|---|---|
| 3,590,228 | A | 6/1971 | Burke |
| 5,134,436 | A | 7/1992 | Fujioka |
| 2003/0043455 | A1 | 3/2003 | Singer et al. |
| 2003/0179377 | A1 | 9/2003 | Masaki |
| 2004/0051984 | A1 | 3/2004 | Oshino |

(Continued)

FOREIGN PATENT DOCUMENTS

| | | |
|---|---|---|
| DE | 10050125 A1 | 4/2002 |
| DE | 37 52 388 T2 | 10/2006 |

(Continued)

OTHER PUBLICATIONS

Machine translation of JP 2005-276932 (Oct. 6, 2005).*

(Continued)

*Primary Examiner* — Peter B Kim
*Assistant Examiner* — Deoram Persaud
(74) *Attorney, Agent, or Firm* — Fish & Richardson P.C.

(57) ABSTRACT

A mirror serves for guiding a radiation bundle. The mirror has a basic body and a coating of a reflective surface of the basic body, the coating increasing the reflectivity of the mirror. A heat dissipating device serves for dissipating heat deposited in the coating. The heat dissipating device has at least one Peltier element. The coating is applied directly on the Peltier element. A temperature setting apparatus has at least one temperature sensor for a temperature of the reflective surface. A regulating device of the Temperature setting apparatus can be connected to the at least one Peltier element and is signal-connected to the at least one temperature sensor. The result is a mirror in which a heat dissipating capacity of the heat dissipating device is improved.

20 Claims, 4 Drawing Sheets

(56) References Cited

U.S. PATENT DOCUMENTS

| | | | |
|---|---|---|---|
| 2004/0145812 A1* | 7/2004 | Chang | 359/630 |
| 2005/0211694 A1* | 9/2005 | Moroz | 219/390 |
| 2006/0262308 A1* | 11/2006 | Sekine | 356/399 |
| 2007/0068566 A1 | 3/2007 | Asatani et al. | |
| 2009/0041182 A1 | 2/2009 | Endres et al. | |
| 2009/0241554 A1 | 10/2009 | Nishida et al. | |
| 2010/0320362 A1* | 12/2010 | Alpert et al. | 250/200 |

FOREIGN PATENT DOCUMENTS

| | | |
|---|---|---|
| DE | 10 2006 020 7 | 11/2007 |
| EP | 1 225 481 | 7/2002 |
| EP | 1 376 185 | 1/2004 |
| JP | 61-124856 A | 6/1986 |
| JP | 01-152639 | 6/1989 |
| JP | 2001-013297 | 1/2001 |
| JP | 2002-118058 | 4/2002 |
| JP | 2004-056125 | 2/2004 |
| JP | 2004-080025 | 3/2004 |
| JP | 2004-247473 | 9/2004 |
| JP | 2004-335585 | 11/2004 |
| JP | 2005-276932 | 10/2005 |
| JP | 2007-095897 A | 4/2007 |
| JP | 2007-116087 A | 5/2007 |
| JP | 2008-039939 A | 2/2008 |
| WO | WO 2007-114317 | 10/2007 |
| WO | WO 2008/034636 | 3/2008 |

OTHER PUBLICATIONS

H. Böttner "Micropelt® Miniaturised Thermoelectric Devices: Small Size, High Cooling Power Densities, Short Response Time" in Proceedings of 24$^{th}$ International Conference on Thermoelectrics (ICT), 2005.

English translation of Japanese Office Action for corresponding JP Appl No. 2010-089881, dated Mar. 16, 2012.

* cited by examiner

MIRROR FOR GUIDING A RADIATION BUNDLE

CROSS-REFERENCE TO RELATED APPLICATIONS

This application claims priority under 35 U.S.C. §119(e)(1) to U.S. Provisional Application No. 61/167,929 filed Apr. 9, 2009. This applications also claims priority under 35 U.S.C. §119 to German Patent Application DE 10 2009 054 869.6, filed Dec. 17, 2009. The contents of both of these applications are hereby incorporated by reference in its entirety.

FIELD

The disclosure relates to a mirror for guiding a radiation bundle. Furthermore, the disclosure relates to an apparatus for setting the temperature of a reflective surface of a mirror of this type, an illumination optical unit for a projection exposure apparatus for microlithography including at least one mirror of this type, a projection optical unit for a projection exposure apparatus for microlithography including at least one mirror of this type, a projection exposure apparatus for microlithography including an illumination optical unit and a projection optical unit, at least one mirror of this type and/or at least one temperature setting apparatus of this type, a method for producing micro- or nanostructured components and a structured component produced by a method of this type.

BACKGROUND

Mirrors of this type are known and are disclosed, for example, in DE 37 52 388 T2, WO 2008/034 636 A2 and EP 1 376 185 A2.

SUMMARY

In some embodiments, the disclosure improves a heat dissipating capacity of the heat dissipating device of the mirror.

It has been recognized according to the disclosure that directly applying the reflectivity-increasing coating on the Peltier element has the effect that heat deposited in the coating can be dissipated from the reflective surface of the mirror directly via the Peltier element.

An accumulation of heat in the basic body of the mirror is avoided or at least substantially reduced in this way. This is advantageous particularly when the coating is embodied as a heat-sensitive multilayer coating. The Peltier element can be connected to a heat reservoir directly or via a passive heat conductor element, the heat reservoir, for its part, dissipating the heat dissipated by the Peltier element. The reflective surface of the Peltier element that is provided with the coating is optically shaped in accordance with the desired optical properties of the mirror.

A multistage Peltier element can have an increased heat dissipating capacity. In this case, the multistage Peltier element can be arranged in such a way that all the stages are coated directly with the coating that increases the reflectivity of the mirror, that is to say are arranged alongside one another below the reflective surface and are in direct thermal contact with the latter. As an alternative, a multistage embodiment of the Peltier elements is also possible in an arrangement in which one of the Peltier elements dissipates heat toward a further one of the Peltier elements, such that this further Peltier element is not in direct thermal contact with the reflective surface and the coating.

A series circuit including single-stage Peltier units represents one example of an arrangement of a plurality of Peltier elements alongside one another below the reflective surface. Efficient heat dissipation away from the reflective surface is thereby possible.

An embodiment including exactly one single-stage Peltier unit is simple in terms of construction.

In some embodiments, a plurality of single-stage Peltier units use a common semiconductor element. This reduces the complexity of the construction. In principle, a joint use in the form of a Peltier element including a plurality of single-stage Peltier units including a common n-doped or p-doped semiconductor element is also possible.

In certain embodiments, the heat-absorbing transition elements are arranged in matrix-like fashion below the reflective surface at least in regions, affords the possibility of targeted driving of specific sections of the reflective surface from which heat is intended to be dissipated. A different arrangement of the transition elements, in particular in a manner adapted in the structure thereof to the form of the distribution of the heat deposited in the coating, is also possible. Arrangements of this type can be formed for example in the form of circles running concentrically around a center of the reflective surface. A shaping of the transition elements which is adapted to elements oder superpositions of elements of an orthogonal function set, for example to a set of Zernike polynomials, is also possible.

Coatings can lead in each case to a direct thermal contact between the coating and the Peltier element.

A holding bridge can combine the functions of a holding structure, on the one hand, and of a heat dissipating device, on the other hand.

A holding bridge can be well adapted to the desired properties in the case of a mirror mount.

In some embodiments, the disclosure controls a temperature in the coating of the mirror.

A temperature setting apparatus can make it possible to achieve regulated heat dissipation away from the reflective surface of the mirror. The temperature sensor can detect the temperature of the reflective surface or a parameter that has a known relationship with the temperature of the reflective surface, in particular in spatially and/or temporally resolved fashion, in particular in real time. Real-time temperature control can be realized in this way. A plurality of temperature sensors can also be provided. In a corresponding manner section by section, individual subunits of the heat dissipating device can then be driven by the temperature setting apparatus. This permits exact temperature control over the reflective surface. For temperature control purposes, the heat dissipating device can have at least one micro-Peltier element. Micro-Peltier elements of this type are known from H. Böttner "Micropelt® Miniaturised Thermoelectric Devices: Small Size, High Cooling Power Densities, Short Response Time" in Proceedings of $24^{th}$ International Conference on Thermoelectrics (ICT), 2005.

With micro-Peltier elements of this type, very fast temperature changes can be brought about, by which an altered heat input on the mirror can be taken into account. Typical response times of such micro-Peltier elements are in the ms range. The micro-Peltier elements have a very high cooling capacity in the range of 500000 W/m$^2$ or even higher still. The micro-Peltier elements are produced on the basis of silicon substrates which can be brought to desired surface specifications for the reflective surface of the mirror with the aid of a corresponding polishing step. With the aid of the temperature setting apparatus according to the disclosure, the temperature of the coating of the mirror can be kept below a predefined value. As an alternative, it is possible to regulate the temperature of the coating to a predefined value. For this purpose, for the case where the heat input via the radiation bundle guided by the mirror does not suffice to maintain the predefined temperature, the at least one Peltier element can also input additional heat into the coating.

The disclosure provides illumination optical units, projection optical units, projection exposure apparatus, production methods, and components. Such embodiments can exhibit advantages that correspond to those which have already been explained above with reference to the mirror according to the disclosure and the temperature setting apparatus according to the disclosure. The projection exposure apparatus can be an EUV projection exposure apparatus.

BRIEF DESCRIPTION OF THE DRAWINGS

Exemplary embodiments of the disclosure are explained in greater detail below with reference to the drawing, in which.

DETAILED DESCRIPTION

Figure 1:
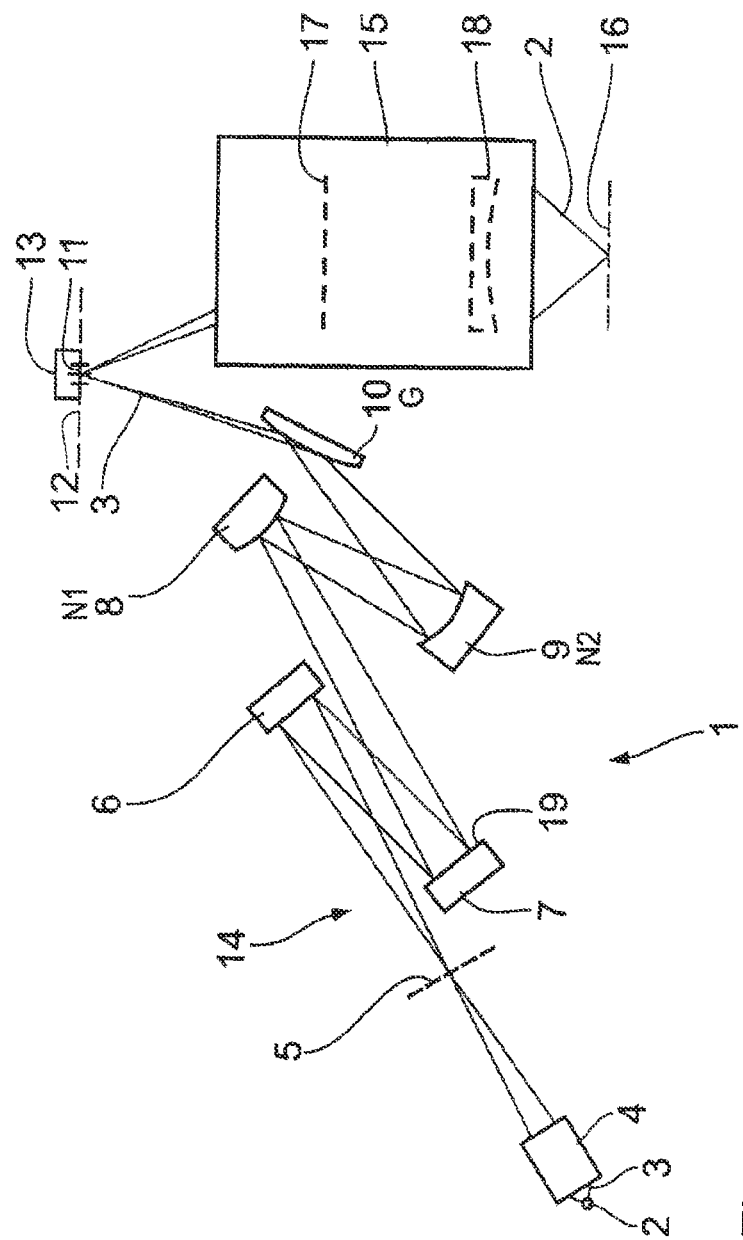
FIG. 1 schematically shows a projection exposure apparatus for EUV microlithography, an illumination optical unit being illustrated in meridional section.

FIG. 1 schematically shows a projection exposure apparatus 1 for EUV microlithography. The projection exposure apparatus 1 has an EUV radiation source 2 for generating bundle 3 of useful radiation, for short: useful radiation bundle. The wavelength of the useful radiation bundle 3 can lie between 5 nm and 30 nm.

The useful radiation bundle 3 is collected by a collector 4. Corresponding collectors are known for example from EP 1 225 481 A and US 2003/0043455 A. Downstream of the collector 4, the useful radiation bundle 3 firstly propagates through an intermediate focal plane 5 and then impinges on a field facet mirror 6. After reflection at the field facet mirror 6, the useful radiation bundle 3 impinges on a pupil facet mirror 7.

After reflection at the pupil facet mirror 7, the useful radiation bundle 3 is firstly reflected at two further mirrors 8, 9. The mirror 8 disposed directly downstream of the pupil facet mirror 7 is also designated hereinafter as N1 mirror. The mirror 9 following the N1 mirror is also designated hereinafter as N2 mirror. Downstream of the N2 mirror, the useful radiation bundle 3 impinges on a mirror 10 for grazing incidence (Grazing Incidence Mirror). This mirror 10 is also designated hereinafter as G mirror.

Together with the pupil facet mirror 7, the further mirrors 8 to 10 image field facets of the field facet mirror 6 into an object field 11 in an object plane 12 of the projection exposure apparatus 1. A surface section of a reflective reticle (13) which has to be imaged is arranged in the object field 11.

The mirrors 6 to 10 and in a broader sense also the collector 4 belong to an illumination optical unit 14 of the projection exposure apparatus 1. A corresponding illumination optical unit including a field facet mirror and a pupil facet mirror is known from DE 10 2006 020 734 A1, for example.

A projection optical unit 15 images the object field 11 into an image field (not illustrated in FIG. 1) in an image plane 16. The pupil facet mirror 7 lies in an optical plane which is optically conjugate with respect to a pupil plane 17 of the projection optical unit 15.

The object field 11 is arcuate, the meridional section of the illumination optical unit 14 that is illustrated in FIG. 1 running through an axis of mirror symmetry of the object field 11. A typical extent of the object field 11 in the plane of the drawing in FIG. 1 is 8 mm. Perpendicular to the plane of the drawing in FIG. 1, a typical extent of the object field 11 is 104 mm. A rectangular object field, for example having a corresponding aspect ratio of 8 mm×104 mm, is also possible.

The projection optical unit 15 is a mirror optical unit. A last mirror 18 of the projection optical unit 15, which is also designated hereinafter as mirror M6, is illustrated by dashed lines in FIG. 1. Upstream of this mirror M6, five further mirrors M1 to M5 (not illustrated in FIG. 1) are arranged in the projection optical unit 15.

Each of the mirrors 6 to 10 of the illumination optical unit 14 and M1 to M6 of the projection optical unit 15 constitutes an optical element having an optical reflective surface 19 to which the useful radiation bundle 3 can be applied. These optical elements are therefore mirrors within the meaning of the present description. The reticle 13, too, constitutes an optical element of this type, that is to say a mirror.

Figure 2:
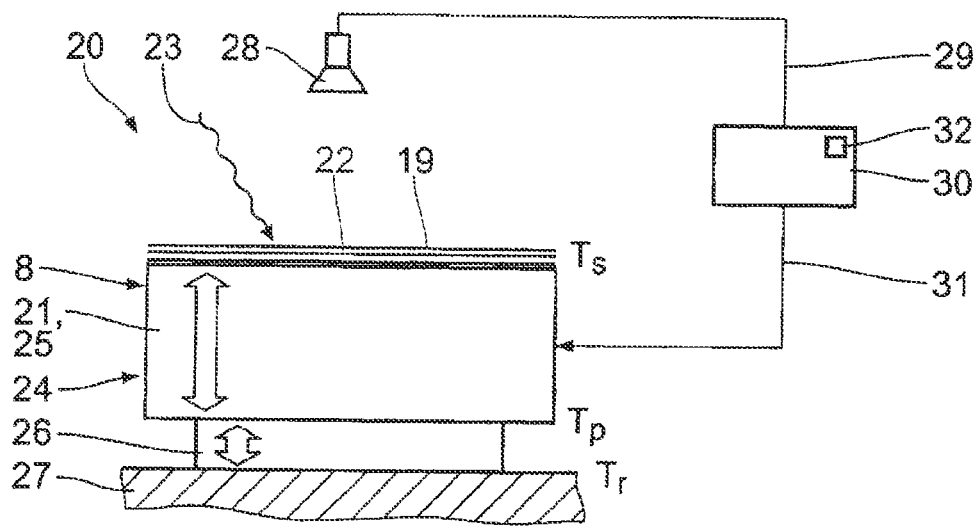
FIG. 2 shows schematically and with regard to mirror components in an axial section an apparatus for setting the temperature of a reflective surface of a mirror for guiding an EUV radiation bundle.

FIG. 2 shows schematically, on the basis of the example of the mirror 8, the construction of an apparatus 20 for setting the temperature of the reflective surface 19 of the mirror 8. Corresponding temperature setting apparatuses 20 can also be provided for the other mirrors of the illumination optical unit 14, the projection optical unit 15 and for the reticle 13. What is described below with regard to the construction of the mirror 8 and with regard to the construction of the temperature setting apparatus 20 can also be present in this form for the other mirror elements of the projection exposure apparatus 1. The mirror 8 is illustrated with a plane reflective surface 19 in a simplifying manner in the following figures.

The mirror 8 has a basic body 21. The reflective surface 19 of the basic body 21 bears a multilayer coating 22 that increases the reflectivity of the mirror 8. The coating can be an alternating layer sequence of molybdenum and silicon layers. The multilayer coating 22 serves for increasing the reflectivity of the mirror 8 for the EUV radiation bundle 3 (not shown in FIG. 2).

A heat dissipating device 24 serves for dissipating heat 23 deposited in the coating 22 via the radiation bundle 3. The heat dissipating device, as will be explained below with reference to FIGS. 3 to 7, has at least one Peltier element 25. The multilayer coating 22 is applied directly on the Peltier element 25. The Peltier element 25 therefore simultaneously constitutes the basic body 21 of the mirror 8.

The Peltier element 25, on a rear side of the mirror 8 remote from the coating 22, is thermally conductively connected to a heat reservoir 27 via a passive heat conductor element 26.

The temperature setting apparatus 20 furthermore has at least one temperature sensor 28 for measuring a surface temperature of the reflective surface 19. In the embodiment according to FIG. 2, the temperature sensor 28 is fitted above the reflective surface 19 in such a way that it is arranged outside the beam path of the radiation bundle 3. The temperature sensor 28 can be for example a thermal imaging camera, e.g. a CCD camera with infrared-sensitive pixels. Other configurations of the temperature sensor 28 are also possible, for example sensor elements which are fitted near the reflective surface 19 in the basic body 21 and are thermally coupled thereto. The sensor elements can be resistance temperature sensor elements of the Pt 100 type. The temperature sensor 28 can output a measured value corresponding to an integrated temperature of the entire reflective surface 19, and in particular of the entire section of the reflective surface 19 to which the radiation bundle 3 is applied. As an alternative, it is possible for the temperature sensor 28 to detect only a section of the reflective surface 19 to which the radiation bundle 3 is applied. The temperature sensor 28 can also detect the reflective surface 19 in spatially and/or temporally resolved fashion. A plurality of the temperature sensors 28 can be provided, which respectively detect mutually adjacent sections of the reflective surface 19.

The Temperature sensor 28 is connected via a signal line 29 to a regulating device 30. The latter is in turn connected via a control line 31 to the Peltier element 25.

The Peltier element 25 constitutes an active thermal element which dissipates heat from the reflective surface 19 toward the passive heat conductor element 26. By virtue of the fact that the multilayer coating 22 is applied directly on the Peltier element 25, the thermal mass and the thermal resistance between the coating 22 and the Peltier element 25 are minimized. Control of the Peltier element 25 and thus of a quantity of heat dissipated by the latter per unit time is possible via the regulating device 30. By adapting the heat capacity dissipated from the reflective surface 19 to the input of heat 23 onto the multilayer coating 22, it is possible to control a temperature $T_s$ of the reflective surface 19. An increased input of heat 23 can be compensated for with an increased heat dissipating capacity by the Peltier element 25, whereby the temperature $T_s$ of the reflective surface 19 can be kept constant, in particular at a predetermined value. For this purpose, the temperature sensor 28 measures the temperature of the reflective surface 19, such that driving of the Peltier element 25 in a manner corresponding to this measurement result is ensured by corresponding feedback in the regulating device 30.

Heat is dissipated from the Peltier element 25 toward the heat reservoir 27 via the passive heat conductor element 26. A heat dissipating capacity via the passive heat conductor element 26 is proportional to a thermal conductivity of the latter and proportional to a temperature difference between a temperature $T_p$ in the coupling region between the Peltier element 25 and the passive heat conductor element 26 and a temperature $T_r$ in the coupling region between the passive heat conductor element 26 and the heat reservoir 27. On account of the Peltier element 25, $T_p$ is greater than $T_s$, such that the heat dissipating capacity of the passive heat conductor elements 26 is thereby increased by the use of the Peltier element 25.

The driving of the Peltier element 25 with the aid of the regulating device 30 makes it possible, in particular, to regulate the temperature of the reflective surface 19 in real time.

The regulating device 30 has a memory 32, for example a RAM component. The measured values of the temperature sensor 28 over a specific period of time and thus the profile of the input of heat 23 onto the reflective surface 19 and thus onto the multilayer coating 22 are stored in the memory 32. Besides the present measured value of the temperature sensor 28, this temporal profile is also used for regulating the Peltier element 25 and serves for setting the temperature of the reflective surface 19 and thus the temperature in the multilayer coating 22.

Figure 3:
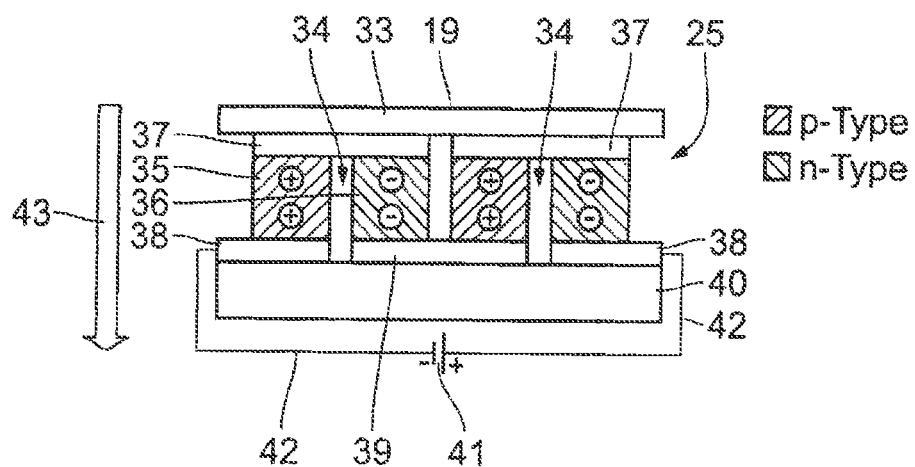
FIG. 3 shows an embodiment of a heat dissipating device for dissipating heat deposited in a coating of the reflective surface.

FIG. 3 shows an embodiment of the Peltier element 25. The latter includes a layer 33, such as e.g. a ceramic layer 33 (e.g. $Al_2O_3$) or a silicon layer, whose top side, that is to say whose side facing upward in FIG. 3, is polished with optical quality and thus constitutes the reflective surface 19.

If the layer 33 is an electrically conductive layer, such as e.g. a silicon layer or a layer including silicon, or, generally, a metal or a semiconductor, then it may be desirable, if appropriate, to apply an additional electrically insulating layer, which may have a thickness of up to a few hundred nanometers, in order to avoid possible undesirable electric currents within the layer 33. A reduction of the efficiency of the Peltier element is thus avoided.

The exemplary embodiment in FIG. 3 is described without restriction to the layer material of the layer 33 on the basis of a ceramic layer. The ceramic layer 33 is illustrated still without the multilayer coating 22 in FIG. 3. Depending on the desired properties of the mirror whose part constitutes the Peltier element 25, the ceramic layer 33 is shaped in plane, convex or concave fashion. The reflective surface 19 of the ceramic layer 33 can be configured as spherical, aspherical or as a freeform surface.

The ceramic layer 33 has a layer thickness in the range of between 50 μm and 1 mm. In particular, the ceramic layer 33 has a thickness in the range from 50 μm to 200 μm.

The Peltier element 25 has a series circuit including two single-stage Peltier units 34. An embodiment having just one Peltier unit 34 or an embodiment having more than two Peltier units 34, for example having three, four, five, ten or even more Peltier units 34, is also possible.

Each of the Peltier units 34 has a p-doped semiconductor element 35 and an n-doped semiconductor element 36 connected in series therewith. A heat-absorbing metallic transition element 37 is connected between the two semiconductor elements 35, 36, the transition element being in thermal contact with the ceramic layer 33 on the side remote from the reflective surface 19.

Sides of the semiconductor elements 35, 36 that are remote from the transition element 37 are electrically conductively connected to metallic coupling elements 38 and to a metallic connecting element 39, respectively. The coupling elements 38 and the connecting element 39 are electrically insulated from one another and, on the opposite side with respect to the ceramic layer 33, are carried by a substrate 40 composed of an electrically insulating material. The substrate 40 can be the passive heat conductor element 26. As an alternative, it is possible for the substrate 40 to be in thermal contact with the then separate passive heat conductor element 26.

The series circuit of the two Peltier units 34 is completed by a voltage source 41, which is connected to the two coupling elements 38 via leads 42. The Peltier element 25 according to FIG. 3 generates a heat flow 43 from the ceramic layer 33 toward the substrate 40.

A further embodiment of a mirror including a heat dissipating device corresponding to the heat dissipating device 24 according to FIG. 2 is explained below with reference to FIG. 4. Components corresponding to those which have already been explained above with reference to FIGS. 1 to 3 bear the same reference numerals and will not be discussed in detail again.

Figure 4:
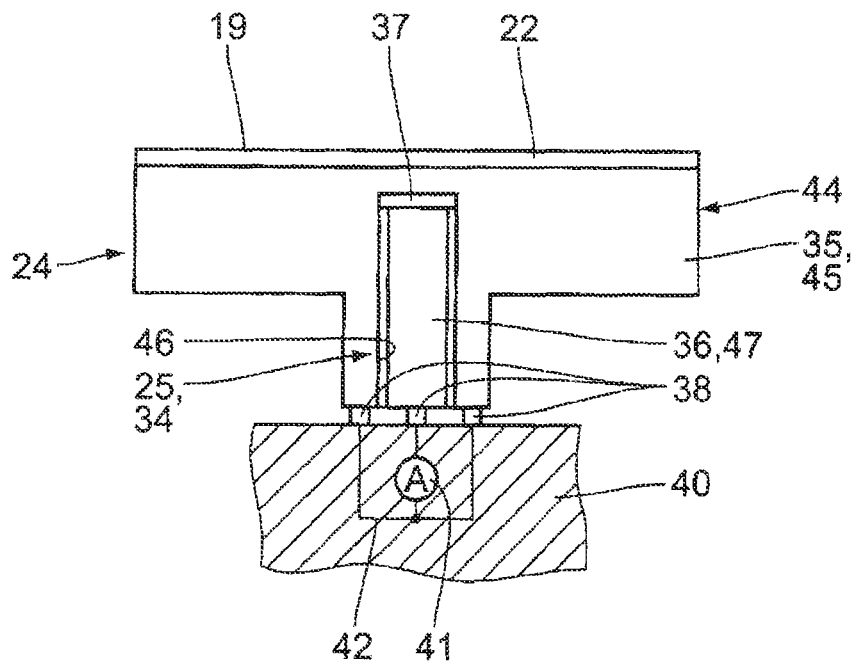
FIGS. 4 to 6 show further embodiments of a heat dissipating device of this type.

FIG. 4 illustrates a micromirror 44, which can be for example a facet element of the field facet mirror 6 or of the pupil facet mirror 7 or a mirror element of a multi-mirror array which is used in the projection exposure apparatus 1. A basic body 45 of the micromirror 44 is simultaneously the p-doped semiconductor element 35 of the Peltier element 25, which has an individual single-stage Peltier unit 34 in the embodiment according to FIG. 4. The basic body 45 is composed of monolithic silicon. As an alternative, the basic body 45 can also be produced from some other semiconductor material or from a compound of different semiconductor materials. The reflective surface 19 of the basic body 45 is optically shaped and polished. The multilayer coating 22 is once again applied on the reflective surface 19. A cylindrical blind opening 46 is etched on the rear side of the basic body 45 remote from the reflective surface 19. The metallic transition element 37 is embodied in the bottom of the blind opening 46, the transition element being arranged closely adjacent to the reflective surface 19, that is to say in the region thereof.

A distance between the transition element 37 and the reflective surface 19 lies in the range of between 10 μm and 500 μm.

The n-doped semiconductor element 36 of the Peltier unit 34 is arranged in the blind opening 46, the semiconductor element being embodied in cylindrical or prismatic fashion. The n-doped semiconductor element 36 is likewise embodied from silicon or some other semiconductor material and is produced by a coating method. An electrical insulation layer 47 is embodied between the outer lateral wall of the n-doped semiconductor element 36 and the inner lateral wall of the blind opening 46 in the p-doped semiconductor element 35. On that side of the basic body 45 which is remote from the reflective surface 19, the coupling elements 38 firstly to the p-doped semiconductor element 35 and secondly to the n-doped semiconductor element 36 are integrally formed in a manner electrically insulated from one another. The coupling elements 38 are once again connected to the voltage source 41 via the leads 42. The semiconductor elements 35, 36 are thermally coupled to the substrate 40 on the side remote from the reflective surface 19. The substrate 40 constitutes a carrier for the micromirror 44.

A further embodiment of a mirror including a heat dissipating device corresponding to the heat dissipating device 24 according to FIG. 2 is explained below with reference to FIG. 5. Components corresponding to those which have already been explained above with reference to FIGS. 1 to 4 bear the same reference numerals and will not be discussed in detail again.

Figure 5:
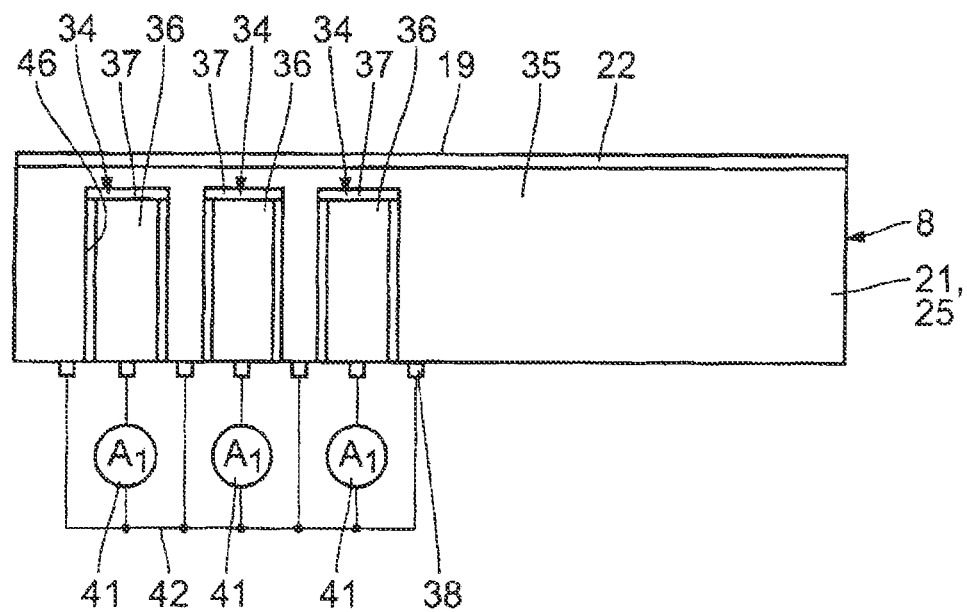

In the embodiment according to FIG. 5, the mirror 8 has a plurality of single-stage Peltier units 34 in the manner of the Peltier unit 34 according to FIG. 4, which together form the Peltier element 25. Three of the Peltier units 34 are illustrated schematically in FIG. 5. Within the basic body 21, the arrangement with the Peltier units 34 continues toward the right in FIG. 5. The Peltier units 34 can be arranged in particular in matrix-like fashion, that is to say in rows and columns, below the reflective surface 19.

In the arrangement according to FIG. 5, the Peltier units 34 have a common p-doped semiconductor element 35. The blind openings 46 for accommodating the n-doped semiconductor elements 36 are embodied in the semiconductor element 35 in a manner corresponding to the number of Peltier units 34.

Figure 6:
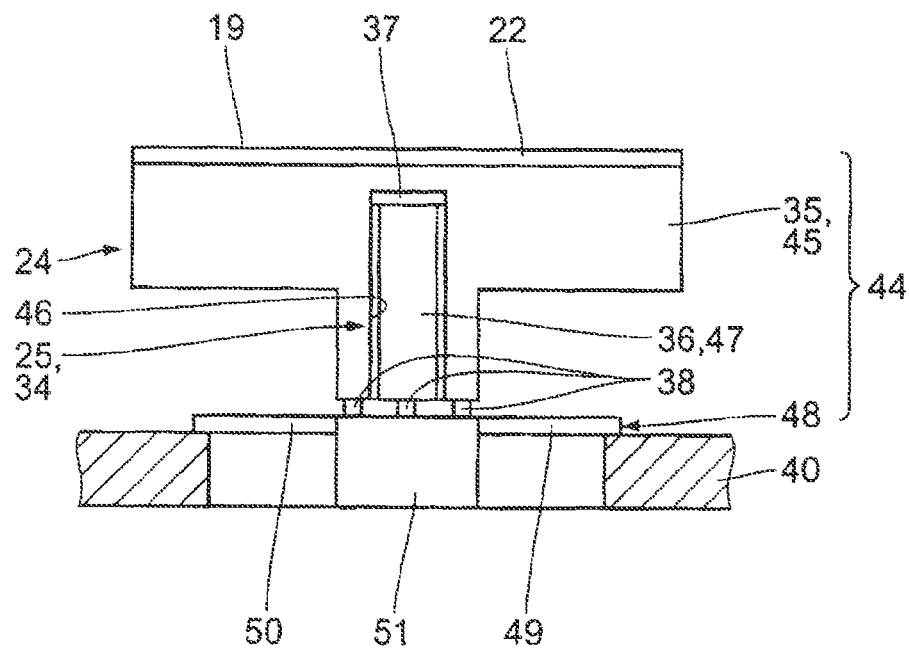
Figure 7:
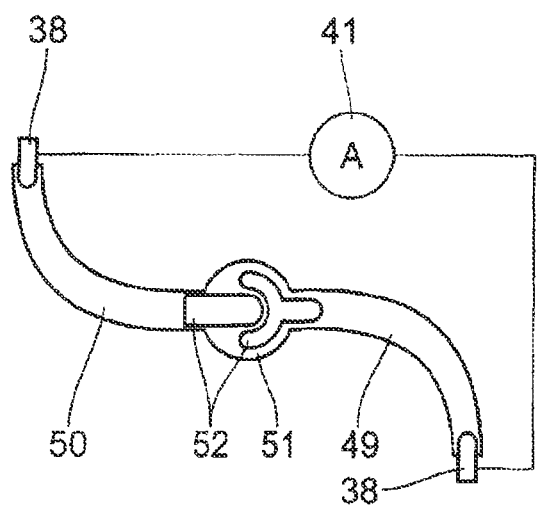
FIG. 7 shows a holding bridge for mounting a basic body of the mirror with the heat dissipating device according to FIG. 6, the holding bridge constituting a part of the heat dissipating device.

A further embodiment of a mirror including a heat dissipating device corresponding to the heat dissipating device 24 according to FIG. 2 is explained below with reference to FIGS. 6 and 7. Components corresponding to those which have already been explained above with reference to FIGS. 1 to 5 bear the same reference numerals and will not be discussed in detail again.

The embodiment according to FIGS. 6 and 7 firstly has a micromirror 44 in the manner of that which was explained in connection with FIG. 4. In the embodiment according to FIGS. 6 and 7, the micromirror 44 is mechanically connected to the substrate 40 via a further single-stage Peltier element 48. The further Peltier element 48 therefore simultaneously serves as a holding bridge for mounting the micromirror 44 on the substrate 40.

The further Peltier element 48 has a p-doped semiconductor element 49 embodied as a spring arm and composed of monolithic silicon or some other suitable semiconductor material, and an n-doped semiconductor element 50 likewise embodied as a spring arm and likewise composed of monolithic silicon or some other suitable semiconductor material. A different number of such spring arms embodied as doped semiconductor elements is also possible, p-doped and n-doped semiconductor elements 49, 50 being used in pairs in each case. The two Peltier elements 34, 48 are connected in series. For this purpose, the two semiconductor elements 49, 50 embodied as spring arms are mechanically connected to one another via a connecting component 51 having metal bridges 52, which are electrically connected to the metallic coupling elements 38.

The metal bridge 52 is connected to the central coupling element 38 (n-doped). The ring-shaped metal bridge 52 is connected to the outer coupling elements 38 (p-doped). The outer coupling element 38, which couples to the p-doped semiconductor, is designed as a hollow cylinder.

The different Peltier units 34 can be driven individually via the voltage sources 41 assigned to the different Peltier units 34 in the embodiment according to FIG. 5. For this purpose, the voltage sources 41 are connected to the regulating device 30 via individual control lines 31 (not illustrated in FIG. 5). A locally different heat dissipation from the reflective surface 19 of the mirror 8 can be realized via the embodiment according to FIG. 5. A correspondingly non-uniform input of heat 23 can thereby be taken into account.

In principle, "p-" and "n-" doped semiconductors are mutually interchangeable in the exemplary embodiments described. As a result, semiconductor pairings such as e.g. p-doped semiconductor with n-doped semiconductor can be replaced by a semiconductor pairing of n-doped semiconductor with p-doped semiconductor. In this case, however, the current direction desirably then is reversed.

With the aid of the projection exposure apparatus 1, at least one part of the reticle 13 is imaged on a region of a light-sensitive layer on a wafer arranged in the image plane 16 for the lithographic production of a micro- or nanostructured component, in particular semiconductor component, for example a microchip. Depending on the embodiment of the projection exposure apparatus 1 as a scanner or as a stepper, the reticle 13 and the wafer are moved in temporally synchronized fashion and continuously in scanner operation or in stepwise fashion in stepper operation.

What is claimed is:

1. An article, comprising:
   a mirror configured to guide a radiation bundle having a wavelength, the mirror comprising:
      a Peltier element; and
      a coating disposed directly on the Peltier element, the coating being reflective to radiation at the wavelength,
   wherein:
      the Peltier element is mounted on a support body via at least one holding bridge;
      the holding bridge comprises a second Peltier element;
      the second Peltier element comprises a first spring arm comprising a p-doped semiconductor element; and the holding bridge comprises a second spring arm comprising an n-doped semiconductor element.

2. The article according to claim 1, wherein the Peltier element comprises a multistage Peltier element.

3. The article according to claim 2, wherein the multistage Peltier element comprises a series circuit comprising single-stage Peltier units, each single-stage Peltier unit comprising:
a p-doped semiconductor element;
an n-doped semiconductor element connected in series with the p-doped semiconductor element; and
a heat-absorbing transition element between the p-doped and n-doped semiconductor elements.

4. The article according to claim 1, wherein the Peltier element comprises exactly one single-stage Peltier unit comprising a p-doped semiconductor element and an n-doped semiconductor element.

5. The article according to claim 1, wherein the Peltier element comprises a plurality of single-stage Peltier units comprising a common p-doped semiconductor element and a respective heat-absorbing transition element.

6. The article according to claim 1, wherein the Peltier element comprises heat-absorbing transition elements are arranged in matrix-like fashion, and the coating is disposed on the heat-absorbing transition elements.

7. The article according to claim 1, wherein the coating is disposed directly on an optically polished surface of the Peltier element.

8. The article according to claim 1, wherein the coating comprises a multi-layer coating.

9. The article according to claim 1, wherein the mirror is devoid of a further substrate or basic body.

10. The article according to claim 1, wherein the coating has first and second surfaces, the first surface of the coating being in direct contact with the Peltier element, and the second surface of the coating is uncontacted by a body.

11. The article of claim 1, wherein:
the Peltier element comprises a layer having an optically polished reflective surface;
the layer comprises a material selected from the group consisting of ceramic, silicon, $Al_2O_3$, metal and a semiconductor;
the coating comprises a reflective multilayer coating applied directly to the optically polished reflective surface; and
the article is an EUV mirror.

12. The article of claim 11, wherein the reflective surface has a shape which is convex, concave or planar.

13. The article of claim 11, wherein the reflective surface has a shape which is plane, spherical, aspherical or freeform.

14. A system, comprising:
an optical unit of a projection exposure apparatus for microlithography, the optical unit comprising an article, the article comprising:
a mirror configured to guide a radiation bundle having a wavelength, the mirror comprising:
a Peltier element; and
a coating disposed directly on layer of the Peltier element, the coating being reflective to radiation at the wavelength,
wherein:
the optical unit is an illumination optical unit or a projection optical unit;
the system is a microlithography projection exposure system;
the Peltier element is mounted on a support body via at least one holding bridge:
the holding bridge comprises a second Peltier element;
the second Peltier element comprises a first spring arm comprising a p-doped semiconductor element; and
the holding bridge comprises a second spring arm comprising an n-doped semiconductor element.

15. The system of claim 14, wherein the optical unit is an illumination optical unit.

16. The system of claim 14, wherein the optical unit is a projection optical unit.

17. The system of claim 14, further comprising:
an apparatus configured to set a temperature of the coating of the mirror, the apparatus comprising:
at least one temperature sensor configured to sense a temperature of the coating; and
a regulating device connectable to the Peltier element, the regulating device being signal-connected to the at least one temperature sensor.

18. A method, comprising:
using an illumination optical unit of a microlithography projection exposure apparatus to illuminate a reticle having structures;
using a projection optical unit of the microlithography projection exposure apparatus to image at least part of the reticle into an image field,
wherein the illumination optical unit or the projection optical unit comprises an article, the article comprises a mirror configured to guide a radiation bundle having a wavelength, and the mirror comprises:
a Peltier element; and
a coating disposed directly on the Peltier element, the coating being reflective to radiation at the wavelength;
the Peltier element is mounted on a support body via at least one holding bridge:
the holding bridge comprises a second Peltier element;
the second Peltier element comprises a first spring arm comprising a p-doped semiconductor element; and
the holding bridge comprises a second spring arm comprising an n-doped semiconductor element.

19. The method of claim 18, wherein a wafer comprising a light-sensitive material is in the image field.

20. An apparatus, comprising:
a mirror configured to guide a radiation bundle having a wavelength, the mirror comprising:
a Peltier element; and
a coating disposed directly on the Peltier element, the coating being reflective to radiation at the wavelength;
at least one temperature sensor configured to sense a temperature of the coating; and
a regulating device connectable to the at least one Peltier element, the regulating device being signal-connected to the at least one temperature sensor,
wherein:
the Peltier element is mounted on a support body via at least one holding bridge:
the holding bridge comprises a second Peltier element;
the second Peltier element comprises a first spring arm comprising a p-doped semiconductor element; and
the holding bridge comprises a second spring arm comprising an n-doped semiconductor element.

* * * * *

UNITED STATES PATENT AND TRADEMARK OFFICE
CERTIFICATE OF CORRECTION

PATENT NO. : 8,717,531 B2  Page 1 of 1
APPLICATION NO. : 12/707783
DATED : May 6, 2014
INVENTOR(S) : Severin Waldis et al.

It is certified that error appears in the above-identified patent and that said Letters Patent is hereby corrected as shown below:

In the Specification

In Col. 2, line 28, delete "oder" and insert -- order --.

In the Claims

In Col. 9, line 57, in Claim 14, delete "on layer of the" and insert -- on the --.

In Col. 10, line 31, in Claim 18, delete "element; and" and insert -- element; --.

Signed and Sealed this
Twenty-sixth Day of August, 2014

Michelle K. Lee
*Deputy Director of the United States Patent and Trademark Office*